United States Patent [19]
Kondo

[11] Patent Number: 5,781,003
[45] Date of Patent: Jul. 14, 1998

[54] ELECTRIC FIELD SENSOR

[75] Inventor: Michikazu Kondo, Sendai, Japan

[73] Assignee: Tokin Corporation, Miyagi, Japan

[21] Appl. No.: 703,617

[22] Filed: Aug. 27, 1996

Related U.S. Application Data

[62] Division of Ser. No. 397,082, Mar. 7, 1995, abandoned.

[30] Foreign Application Priority Data

Jul. 7, 1993 [JP] Japan .................. 5-168018
Oct. 8, 1993 [JP] Japan .................. 5-253318
Mar. 18, 1994 [JP] Japan .................. 5-48843

[51] Int. Cl.$^6$ .................................................. G01R 23/16
[52] U.S. Cl. ........................................ 324/96; 324/750
[58] Field of Search .................... 324/158.1, 73.1,
324/96, 244.1, 750, 751, 752, 95, 719;
359/328, 240, 248; 385/122, 132, 8; 250/227.11,
227.19

[56] References Cited

U.S. PATENT DOCUMENTS

| | | | |
|---|---|---|---|
| 4,070,621 | 1/1978 | Bassen et al. ................ | 324/96 |
| 4,147,979 | 4/1979 | Baues et al. ................. | 324/96 |
| 4,210,407 | 7/1980 | Ito et al. . | |
| 4,533,829 | 8/1985 | Miceli et al. . | |
| 4,719,412 | 1/1988 | d'Humieres et al. . | |
| 4,791,388 | 12/1988 | Sanford et al. ............... | 359/328 |
| 4,841,234 | 6/1989 | Aoshima et al. ............. | 324/96 |
| 5,029,273 | 7/1991 | Jaeger . | |
| 5,121,250 | 6/1992 | Shinozaki et al. ........... | 359/328 |
| 5,210,407 | 5/1993 | Ito et al. ...................... | 324/96 |
| 5,267,336 | 11/1993 | Sriram et al. ................ | 324/96 |
| 5,278,499 | 1/1994 | Ito et al. ...................... | 324/244.1 |

FOREIGN PATENT DOCUMENTS

| | | |
|---|---|---|
| 187091 | 7/1986 | European Pat. Off. . |
| 56-157866 | 12/1981 | Japan . |
| 57-24863 | 2/1982 | Japan . |
| 57-171271 | 10/1982 | Japan . |
| 58-48863 | 3/1983 | Japan . |
| 2-77656 | 3/1990 | Japan . |

OTHER PUBLICATIONS

Patent Abstracts of Japan, vol. 11, No. 270 (P–6111), Sep. 3, 1987 & JP-A-62 070777 (Fujikura), Apr. 1, 1987.
Journal of Lightwave Technology, vol. LT-5, No. 6, Jun. 6, 1987 New York, USA, pp. 745–750, Jaeger et al: Asymmetric Slab and Strip-Loaded Integrated Optical Devices.
Patent Abstracts of Japan, vol. 18, No. 48 (P–J682), Jan. 25, 1994 & JP-A-05 273260 (Yokogawa Electric Corp.), Oct. 22, 1993.

Primary Examiner—Vinh P. Nguyen
Attorney, Agent, or Firm—Frishauf, Holtz, Goodman, Langer & Chick

[57] ABSTRACT

By using an electric field sensor comprising a sensor head 100 for producing a transmitted light wave having an intensity which varies in dependence upon an intensity of an electric field applied thereto, an optical fiber 8 for delivering a light wave from a light source 1 to the sensor head 100 to make the light wave be incident thereto, an optical fiber 9 for delivering the transmitted light wave of the sensor head 100 to a photoelectric transducer 10, and a measuring unit 11 for measurement and display of an electric signal from the photoelectric transducer 10, an electromagnetic noise or an electromagnetic leaking wave is detected as variation of the light intensity by locating the sensor head 100 in the vicinity of a source of the electromagnetic noise or the leaking wave without contacting the source.

1 Claim, 10 Drawing Sheets

ELECTRIC FIELD SENSOR

This is a division of application Ser. No. 08/397,082 filed Mar. 7, 1995, now abandoned.

TECHNICAL FIELD

This invention relates to an electric field sensor for use in detecting an electromagnetic noise and an electromagnetic leaking wave and in detecting an electric field generated by a high-voltage device.

BACKGROUND ART

Development of electronics, in particular, computer apparatus and digital apparatus brings about a flood of electromagnetic leaking waves and electro-magnetic noises. This is growing into many social problems. It is therefore a social demand to suppress occurrence of the electromagnetic noises. Simultaneously, it is desired to establish an improved technique for detection and measurement with a high precision.

No method is present in order to detect an electric field within a vacuum unit of a high-pressure accelerator or a high-pressure plasma generator. It is therefore desired to achieve a small-sized sensor. Likewise, a method is not yet present in order to directly measure electric field distribution within a microwave oven. Indirect measurement has been resorted to which is based on a phenomenon that a substance containing water absorbs a microwave and is increased in temperature. In addition, detection of the electric field is essential in maintenance and state monitoring of equipments including power transmission lines in a power supply facility.

As a method of detecting the electromagnetic noise or the electromagnetic leaking wave, there is known a method using an electrooptical crystal (EO crystal) arranged adjacent to a surface of a measurement object. The electric field thereon is converted by an electrooptical effect into light intensity to be detected. This method of detecting the surface electric field by the use of the electrooptical effect is characterized by noncontacting measurement of a voltage or a noise waveform on a fine surface of a circuit element.

FIG. 1 shows the method of detecting the surface electric field by the use of the electrooptical effect. An outgoing light beam 51 emitted from a semiconductor laser 50 is converted by a lens 52 into parallel light beams which pass through a polarization prism 53 and a half-wavelength plate 54 to be reflected by a mirror 55 and to be incident by a lens 56 to an electrooptical crystal 57 located in the vicinity of a measurement objective circuit 58. Inasmuch as the incident light beam varies in its polarization state in response to an electric field applied to the crystal by the measurement objective circuit 58, the variation is separated by the polarization prism 53 to be detected by an optical detector 59 and to be displayed on a display unit 60.

It is general that the above-described optical system is assembled into a microscope in order to remove a mechanical instability and that the measurement objective circuit 58 is a circuit on a flat substrate such as a wafer and a chip. According to this method, it is difficult to carry out measurement in a narrow space within a device containing electronics parts and apparatus. This is because the optical system composed of the polarization prism and so on has a large size and the light beam must be spatially propagated to be directed to the measurement objective circuit 58.

FIG. 2 schematically shows a structure of an optical voltage sensor which has been conventionally used in detection of the electric field. When the electric field is applied to the electrooptical crystal such as BGO (bismuth-germanium-oxide: $Bi_{12}GeO_{20}$), a refractive index varies in proportion to the intensity of the electric field applied thereto. This feature (Pockels effect) is utilized in detection of the electric field. Specifically, the voltage of a high-voltage conductor is divided and applied to electrodes 25 of a BGO crystal 21. The polarization state of the light beam passing through a polarizer 22 is converted within the crystal 21. The light beam after conversion of the polarization state is incident through a wavelength plate 24 to a photodetector 23. A transmitted light beam subjected to intensity modulation by the photodetector 23 is converted by a photoelectric converter (not shown) into an electric signal to be detected. By arranging in a power supply facility in a remote area and by the use of an optical fiber, the above-mentioned-method has been used in state monitoring, for example, detection of an accident such as connection to the ground, short connection, line disconnection, and thunderbolt.

However, the above-mentioned method of detecting an electric field by the use of the Pockels effect has a following disadvantage. That is, the voltage required to apply the electric field to the electrooptical crystal is practically as high as 500 volts or more although it is divided. Accordingly, a special countermeasure is required to secure the safety.

It is therefore an object of this invention to provide an electric field sensor of a small size.

It is another object of this invention to provide an electric field sensor which enables detection of an electric field or a noise in a narrow space.

It is still another object of this invention to provide an electric field sensor which prevents production of a noise by a measuring system itself and capture of any other noise by other structural components except the sensor.

It is a further object of this invention to provide an electric field sensor in which presence of a measuring system has no influence upon a measurement objective system.

It is a still further object of this invention to provide an electric field sensor which is capable of carrying out non-contacting measurement of an electric field produced on a surface of a circuit element.

It is a specific object of this invention to provide an electric field sensor which is capable of detecting an electric field produced by a high-voltage device without contacting the high-voltage device and which is improved in safety and is easy in installation.

SUMMARY OF THE INVENTION

According to a first aspect of this invention, there is provided an electric field sensor comprising a sensor head for producing a transmitted light wave having an intensity which varies in dependence upon an intensity of an electric field applied thereto; a light source for producing a light wave; a first optical fiber for delivering the light wave from the light source to the sensor head; a photoelectric transducer for converting an input light wave into an electric signal; and a second optical fiber for delivering to the photoelectric transducer as the input light wave the transmitted light wave of the sensor head; the sensor head being located out of contact with a measurement object for detecting, as variation in light intensity, the electric field applied by the measurement object.

According to a second aspect of this invention, there is provided an electric field sensor comprising a sensor head having an optical waveguide so that an incident light beam incident to one end face of the optical waveguide is reflected at the other end face of the optical waveguide to be emitted from the one end face as an outgoing light beam and that the outgoing light beam has an intensity which varies in dependence upon an intensity of an electric field applied thereto; a light source for producing a light wave; an optical fiber; a photoelectric transducer for converting an input light wave into an electric signal; and a circulator for delivering the light wave from the light source to the optical fiber to supply the light wave to the sensor head as the incident light beam and for delivering to the photoelectric transducer as the input light wave the outgoing light beam received from the sensor head through the optical fiber; the sensor head being located out of contact with a measurement object for detecting, as variation in light intensity, the electric field applied by the measurement object.

BRIEF DESCRIPTION OF THE INVENTION

DETAILED DESCRIPTION

Figure 1:
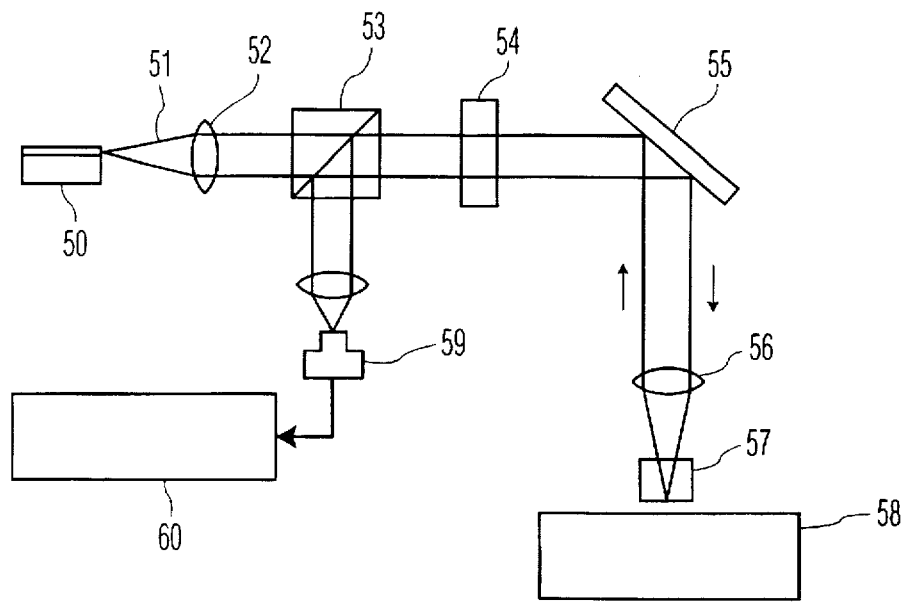
FIG. 1 is a block diagram of a device for carrying out a conventional method of detecting an electromagnetic noise or an electromagnetic leaking wave.
Figure 2:
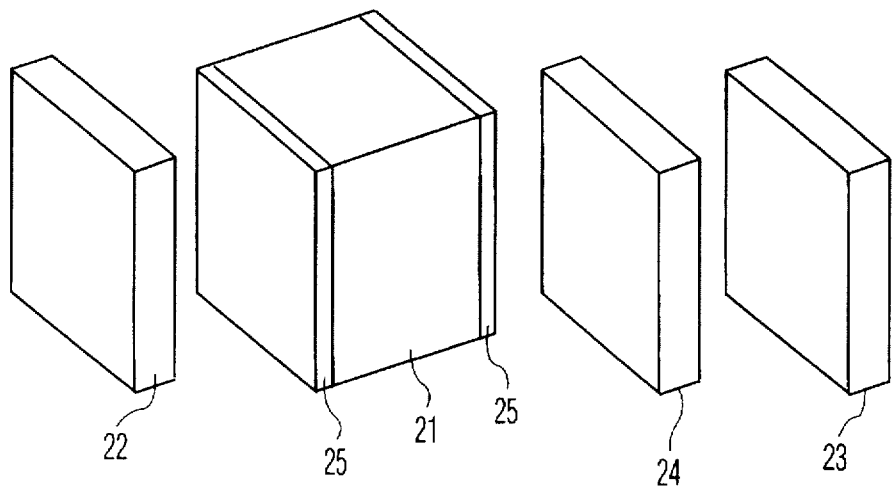
FIG. 2 is a diagram which schematically shows a conventional optical voltage sensor.

Now, embodiments of this invention will be described with reference to the drawing.

Figure 3:
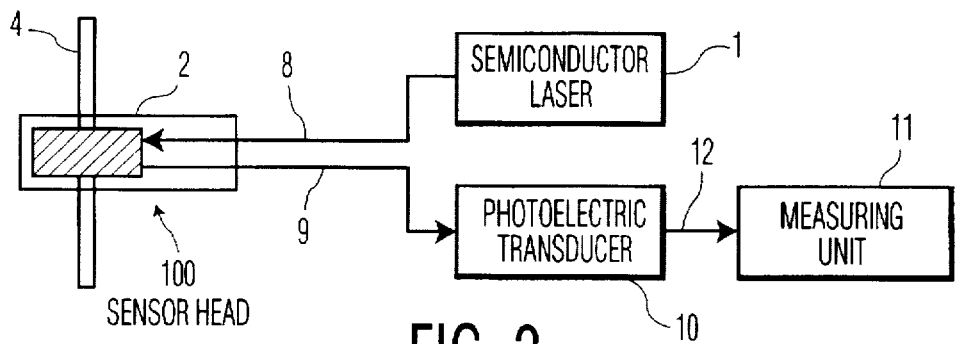
FIG. 3 is a block diagram of an electric field sensor according to a first embodiment of this invention.
Figure 4:
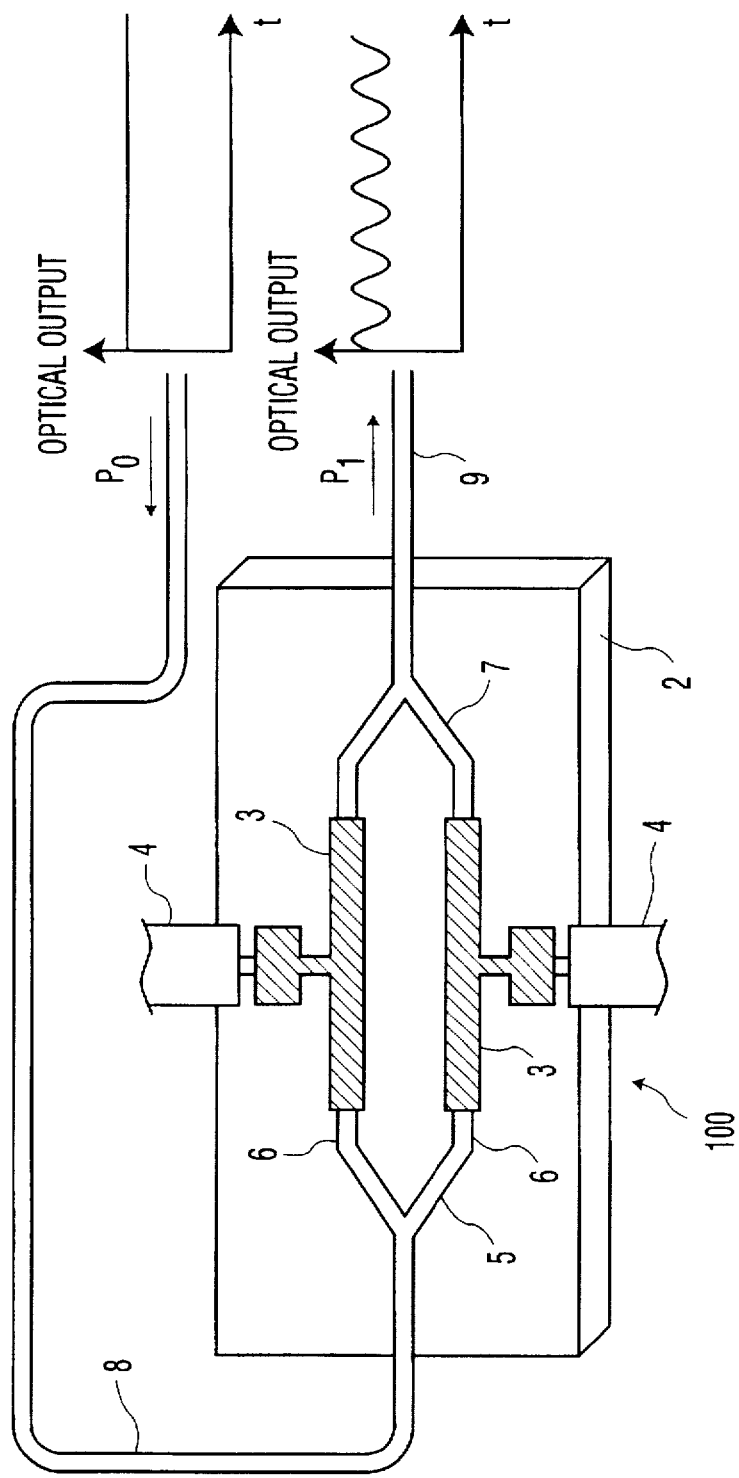
FIG. 4 is a diagram showing an enlarged view of a sensor head of the electric field sensor of FIG. 3, together with variation of an input light beam and an output light beam.

Referring to FIGS. 3 and 4, an electric field sensor according to a first embodiment of this invention comprises a sensor head 100. The sensor head 100 comprises an optical waveguide formed on a substrate 2 made of a lithium niobate crystal which is an electrooptical crystal. Electrodes 3 are formed in the vicinity of the optical waveguide. Each electrode 3 is connected to an antenna 4 integral with the sensor head 100. A laser beam from a semiconductor laser 1 is introduced through an optical fiber 8 to an incident optical waveguide 5 of the sensor head 100. An output of the sensor head 100 is transmitted through an optical fiber 9 to a photoelectric transducer 10. The output of the sensor head 100 is converted by the photoelectric transducer 10 into an electric signal. The electric signal is supplied through a wire cable 12 to a measuring unit 11. The measuring unit 11 is responsive to the electric signal and carries out noise measurement and display.

Specifically, the sensor head 100 comprises the optical waveguide in which the incident optical waveguide 5 is branched into two phase-shift optical waveguides 6 which are joined again, and the antennas 4 connected to the electrodes 3 located in the vicinity of the phase-shift optical waveguides 6. When a noise is caught by the antennas 4, an electric field is produced at the phase-shift optical waveguides 6 to bring about local variation of a refractive index. As a result, a phase difference is produced between light waves propagating through the two phase-shift optical waveguides 6 and is detected at an output end of an outgoing optical waveguide 7 as variation in light intensity. Thus, the phase-shift optical waveguides 6 have refractive indexes which vary in response to an intensity of the electric field applied thereto.

An electric field detection sensitivity of the sensor head 100 is decreased with a reduction in length of the antennas 4. When the antenna has a length of 14 mm, the minimum sensitivity is equal to 1 mV/m and it is possible to measure the electric field of 10 V/m or more. When the antenna length is shortened, a high electric field can be measured although the sensitivity is degraded.

Figure 5:
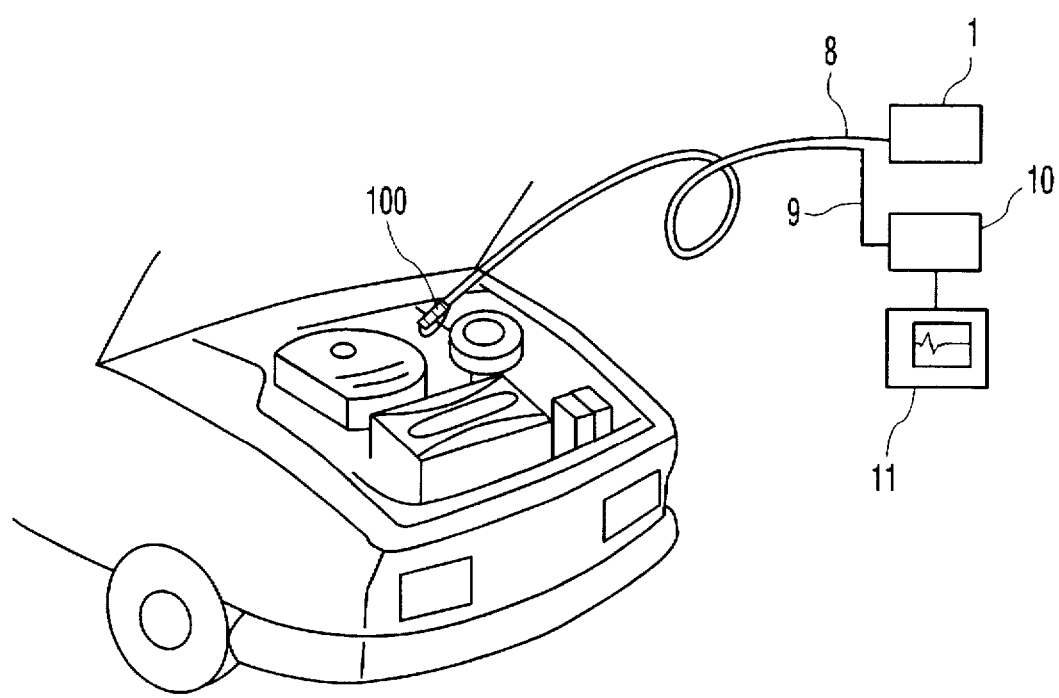
FIG. 5 is a diagram which exemplifies a case where the electric field sensor of FIG. 3 is used in measurement of a noise emitted by an automobile with a gasoline-engine.

Referring to FIG. 5, illustration is made of a case where the electric field sensor of FIG. 1 is used in measurement of a noise produced by an automobile with a gasoline engine. The sensor 100 is connected to an end of the optical fiber 8 connected to a laser light source of the semiconductor laser 1. An outgoing light beam emitted from the sensor head 100 is coupled through the optical fiber 9 to the photoelectric transducer (optical detector) 10. The measuring unit (meter) 11 displays a noise waveform as detected. Measurement was made of noise levels in an engine room and in a control unit including a microcomputer, respectively. As a consequence, it has been confirmed that the waveform of the electromagnetic noise is precisely detected.

Use was also made of the sensor head comprising the optical waveguide formed on a substrate made of a lithium tantalate crystal which is an electrooptical crystal. As a result, the sensitivity in detection of the electric field intensity was equivalent to that of the sensor head formed on the substrate made of a lithium niobate crystal.

Figure 6:
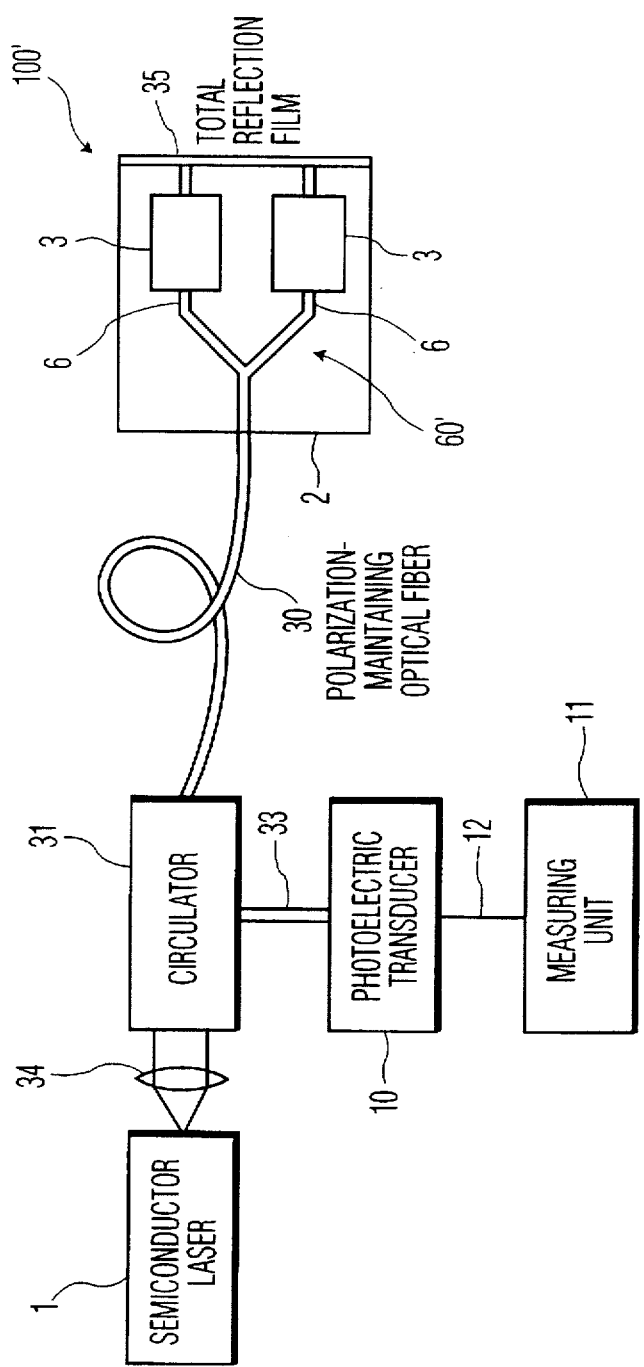
FIG. 6 is a block diagram of an electric field sensor according to a second embodiment of this invention.

Referring to FIG. 6, an electric field sensor according to a second embodiment of this invention comprises a sensor head 100'. In this embodiment, the sensor head 100' is of a reflection type. A total reflection film 35 is formed at the end faces of phase-shift optical waveguides 6. An incident light beam and a reflected light beam are transmitted through a single polarization-maintaining optical fiber 30. Electrodes 3 formed in the vicinity of a branch reflection type optical waveguide 60' also serve as antennas. A circulator 31 delivers a light beam from a laser light source of the semiconductor laser 1 to the optical fiber 30 to supply the light beam to the sensor head 100' as the incident light beam. The circulator also supplies the photoelectric transducer 10 with an outgoing light beam received from the sensor head 100' through an optical fiber 33. Thus, the circulator 31 acts as an optical directional splitter. Instead of the circulator 31, an optical directional coupler may be used as the optical directional splitter. A lens is depicted at 25. The sensor head 100' used in this embodiment has a size of 3×25×0.2 mm.

The electric field sensor having the above-mentioned structure was used in noise measurement in a device with a circuit board mounted and put in operation. The sensor head 100' was inserted between a number of printed circuit boards with electrical circuits formed thereon to measure an electric field and a noise in a narrow space between the boards. As a result, effectivity of the electric field sensor was confirmed.

With the structure of the device illustrated in FIG. 6, noncontacting detection was carried out by the sensor head 100' according to this invention to detect a signal waveform of a leaking electric field applied between a signal line of the electrical circuit formed on the printed board and ground. The sensor head 100' has a flat sensitivity characteristic in a measured frequency band from DC to about several GHz and can precisely reproduce the signal waveform within the band. On a typical printed board, a distance between a signal line or an electric part and a ground line is not greater than several millimeters. Accordingly, the electric field intensity in a small area on the surface of the printed board ranges between 0.1 V/m and 10 KV/m. Thus, detection is possible even with a probe in which the electrodes also serve as the antennas and the effective antenna length is short. Likewise, by the use of the sensor head 100 illustrated in FIG. 4, noncontacting detection is also carried out to detect the signal waveform of the leaking electric field applied between the signal line of the electrical circuit formed on the printed board and ground.

Figure 7:
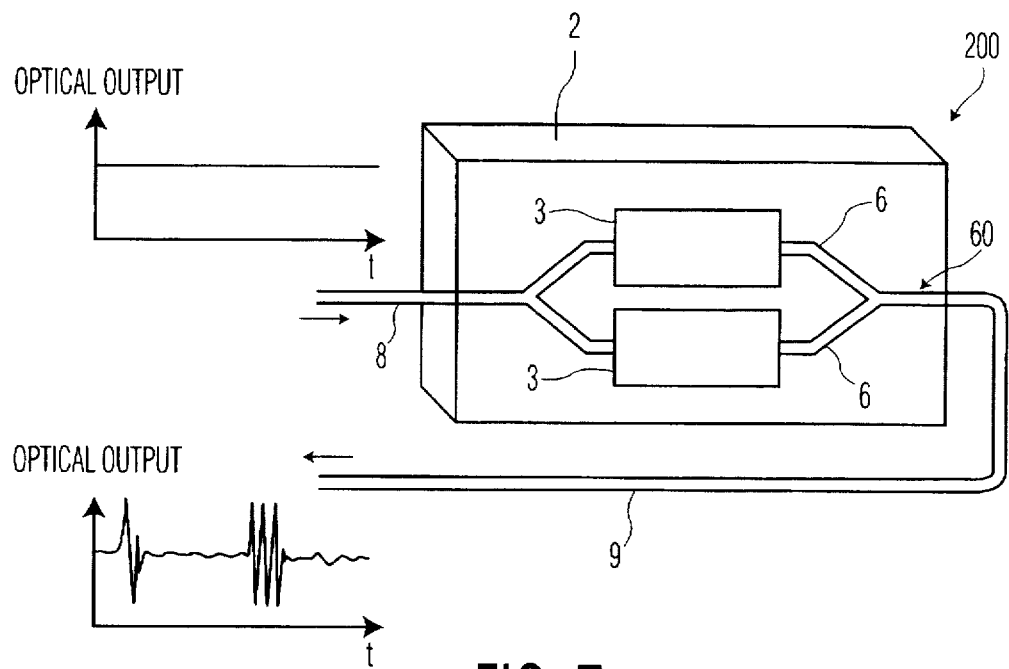
FIG. 7 is a diagram showing a sensor head which can be used in place of the sensor head of the electric field sensor of FIG. 3, together with variation of an input light beam and an output light beam.

Referring to FIG. 7, illustration is made of a sensor head 200 which can be used instead of the sensor head 100 of the electric field sensor of FIG. 3. In addition, illustration is made of variation of an input light beam and an output light beam of the sensor head 200 when the sensor head 200 is arranged, in a noncontacting state, in the vicinity or inside of a high-voltage device applied with a high voltage to detect, as variation in light intensity, the electric field produced by the high-voltage device. The sensor head 200 comprises a branch interference type optical waveguide 60 formed on a substrate 2 made of a lithium niobate crystal which is an electrooptical crystal. In the branch interference type optical waveguide 60, a light beam incident through an optical waveguide 8 is branched by two phase-shift optical waveguides (namely, branched optical waveguides) 6 into branch light beams which are again coupled to be emitted through an optical fiber 9. Electrodes 3 are formed on the two phase-shift optical waveguides (namely, the branched optical waveguides) 6, respectively. Alternatively, the electrodes 3 may be formed in the vicinity of the two phase-shift optical waveguides (namely, the branched optical waveguides) 6 along the two phase-shift optical waveguides (namely, the branched optical waveguides) 6, respectively. The electric field produced by a high-voltage device (not shown) is applied to the electrodes 3 of the sensor head 200 located, in a noncontacting state, in the vicinity or inside of the high-voltage device. This brings about local variation in the refractive index. As a result, a phase difference is produced between the light beams propagating through the two phase-shift optical waveguides 6 and is detected at an output end of the branch interference type optical waveguide 60 as variation in light intensity.

With a similar structure using the sensor head comprising the branch interference type optical waveguide 6 which is similar to that of FIG. 7 and which is formed on the substrate made of a lithium tantalate crystal which is an electrooptical crystal, the similar effect was obtained as in the case of FIG. 7.

Figure 8:
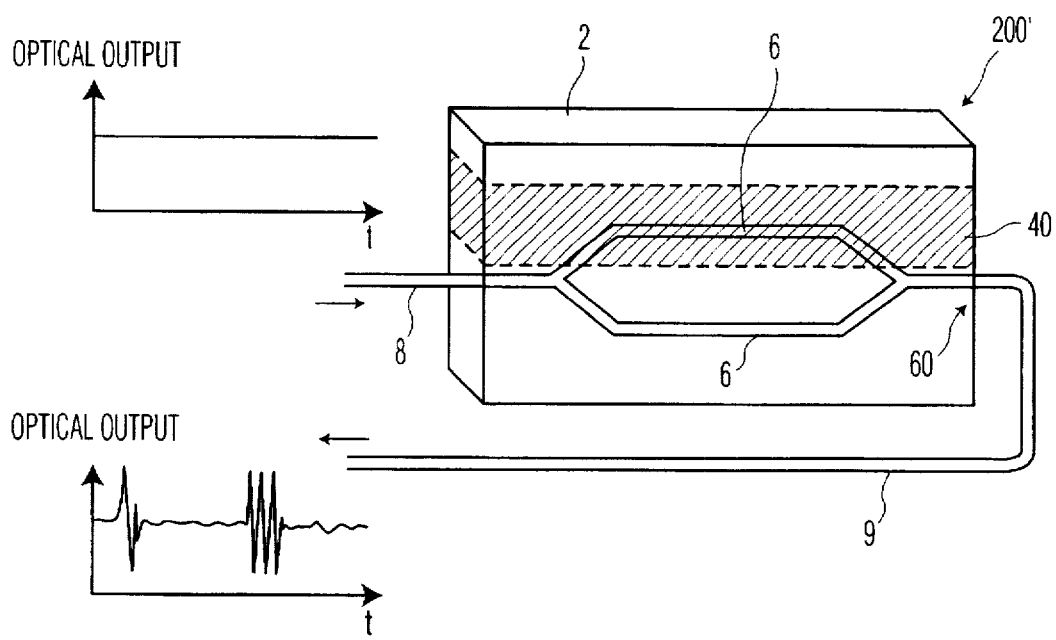
FIG. 8 is a diagram showing a sensor head which can be used in place of the sensor head illustrated in FIG. 7, together with variation of an input light beam and an output light beam.

FIG. 8 shows another sensor head 200' which is used instead of the sensor head 200 in FIG. 7. The sensor head 200' comprises a branch interference type optical waveguide 60, similar to that of FIG. 7, formed on a substrate 2 made of a lithium niobate crystal which is a ferroelectric crystal. At an area 40 in which one of two phase-shift optical waveguides (namely, branched optical waveguides) 6 is formed, the polarization direction of the crystal is reversed by 180 degrees from that of the remaining area. Herein, it is sufficient that at least a part of the area in which one of the two phase-shift optical waveguides (namely, the branched optical waveguides) 6 is formed has a polarization direction substantially opposite to the polarization direction of the remaining area of the substrate 2. In this sensor head 200', the electrodes 3 of FIG. 7 are unnecessary. When the sensor head 200' is applied with an electric field, the refractive index is locally varied. As a result, a phase difference is produced between light beams propagating through the two phase-shift optical waveguides 6 and detected at an output end of the branch interference type optical waveguide 60 as variation in light intensity.

When the sensor head similar to that of FIG. 8 is formed on a substrate made of a lithium tantalate crystal which is a ferroelectric crystal, the similar effect is obtained as in the case of FIG. 8.

Figure 9:
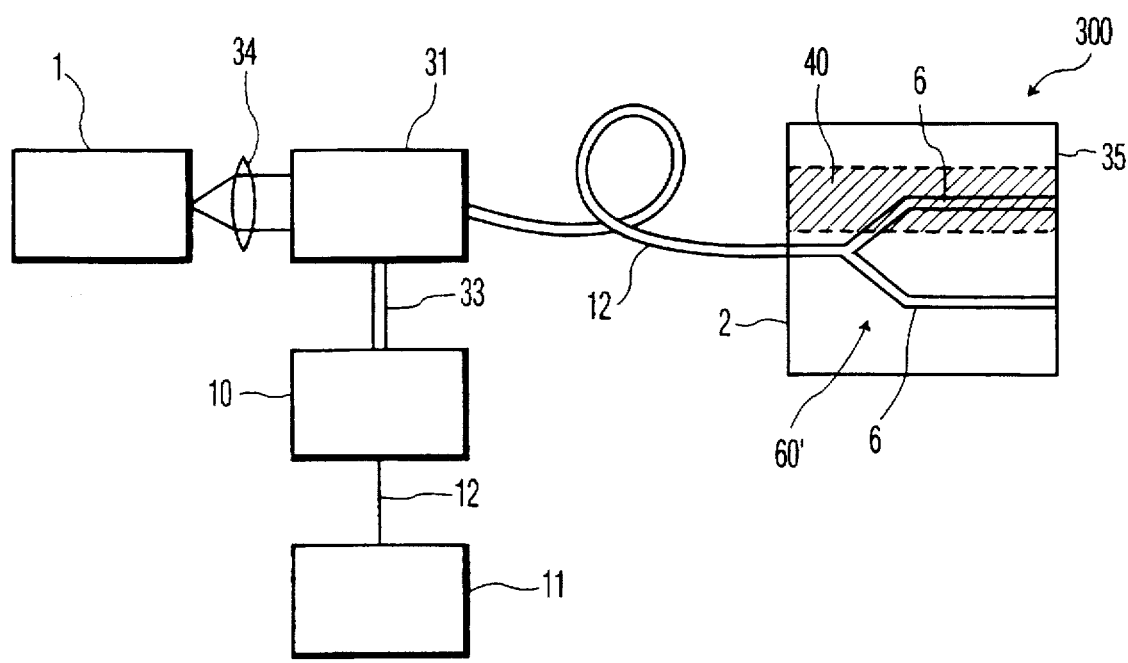
FIG. 9 is a block diagram of an electric field sensor according to a third embodiment of this invention.

Referring to FIG. 9, an electric field sensor according to a third embodiment of this invention is similar to that illustrated in FIG. 6 except that another sensor head 300 is used instead of the sensor head 100' of the electric field sensor of FIG. 6. The sensor head 300 is of a reflection type and comprises a branch reflection type optical waveguide 60', similar to that of FIG. 6, formed on a substrate 2 made of a lithium niobate crystal which is a ferroelectric crystal. At an area 40 in which one of two phase-shift optical waveguides (namely, branched optical waveguides) 6 is formed, the polarization direction of the crystal is reversed by 180 degrees from that of the remaining area. Herein, it is sufficient that at least a part of the area, in which one of the two phase-shift optical waveguides (namely, the branched optical waveguides) 6 is formed, has a polarization direction substantially opposite to the polarization direction of the remaining area of the substrate 2. In this sensor head 300, the electrodes 3 of FIG. 6 are unnecessary. When the sensor head 300 is applied with an electric field, the refractive index is locally varied. As a result, a phase difference is produced between light beams propagating through the two phase-shift optical waveguides 6 and is detected at an output end of the branch interference type optical waveguides 60' as variation in light intensity.

When the sensor head similar to that of FIG. 9 is formed on a substrate made of a lithium tantalate crystal which is a ferroelectric crystal, the similar effect is obtained as in the case of FIG. 9.

Now, description will be made about an optical output characteristic of the sensor head 100 illustrated in FIG. 4.

The sensor head 100 comprises the substrate 2 made of a lithium niobate crystal vertically cut with respect to a c axis. The incident optical waveguide 5, the phase-shift optical waveguides 6 branched from the incident optical waveguide 5, and the outgoing optical waveguide 7 into which the phase-shift optical waveguides 6 are joined are formed on the substrate 2 by diffusion of titanium. The incident end of the incident optical waveguide 5 is connected to the optical fiber 8. The outgoing end of the outgoing optical waveguide 7 is connected to the optical fiber 9.

A pair of the electrodes 3 are formed on the phase-shift optical waveguides 6. The electrodes 3 are connected to the rod antennas 4. The incident light beam through the optical fiber 8 is incident to the incident optical waveguide 5 and then divided in energy by the phase-shift optical waveguides 6. When the electric field is applied, an electric voltage is applied across the electrodes 3 by the rod antennas 4. In the phase-shift optical waveguides 6, electric field components opposite to each other in a depth direction are produced. As a result, the refractive index is varied due to the electrooptical effect. A chase difference is produced between the light waves propagating through the both phase-shift optical waveguides 6 in correspondence to the magnitude of the applied electric field. When the light waves are combined in the outgoing optical waveguide 7, the light intensity is varied due to interference. Thus, the intensity of the outgoing light beam emitted through the optical fiber 9 is varied in correspondence to the intensity of the applied electric field. Accordingly, the intensity of the applied electric field can be measured by detecting the variation in light intensity.

Figure 10:
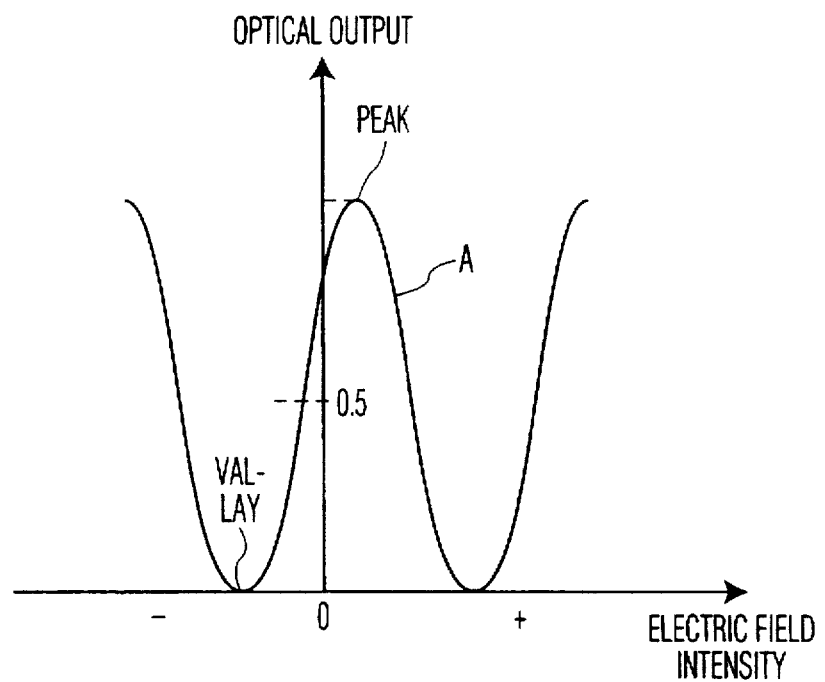
FIG. 10 is a diagram showing a characteristic of the sensor head illustrated in FIG. 4.

One example of the optical output characteristic of the electric field sensor head 100 is depicted at a curve A in FIG. 10. Preferably, an optical output level when no electric field is applied (bias point) is a middle point between a peak and a valley. If the two phase-shift optical waveguides are manufactured with ideal symmetry, their phases are identical. In this event, an optical operating point is located at the peak of the optical output characteristic curve. This means inoperability as an electric field sensor. Generally, the bias point of the electric field sensor head is determined by the phase difference between the light waves. Such phase difference is derived from asymmetry of the two phase-shift optical waveguides that is produced during manufacture. This depends upon tolerances and process conditions in manufacture.

Those sensor heads which will hereinafter be described have a bias point constantly located at a middle point between a peak and a valley. Those sensor heads are hardly affected by the tolerances and the process conditions in manufacture and have a constant sensitivity.

Figure 11:
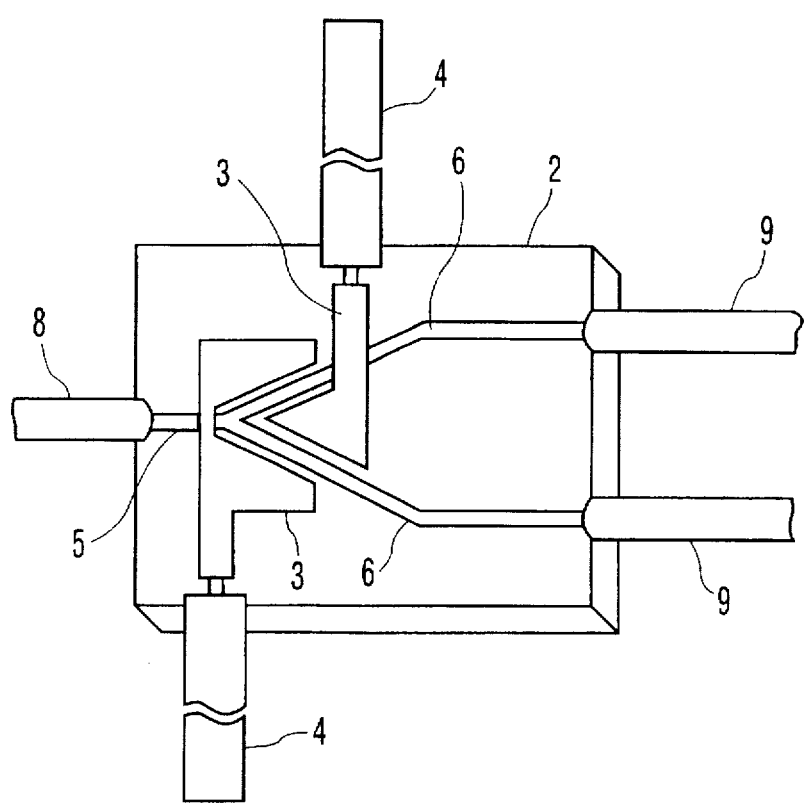
FIG. 11 is a diagram showing a sensor head which can be used in place of the sensor head illustrated in FIG. 4.

Referring to FIG. 11, a sensor head illustrated comprises a substrate 2, an incident optical waveguide 5 formed on the substrate 2 and connected to an optical fiber 8, at least two branched optical waveguides 6 formed on the substrate 2 and branched from the incident optical waveguide 5, at least one pair of electrodes 3 formed in the vicinity of a branching portion of the branched optical waveguides 6. An optical fiber 9 is connected to at least one outgoing end of the branched optical waveguides 6.

The branched optical waveguides 6 are formed on the substrate (X plate) 2 made of a lithium niobate crystal to be symmetrically branched in a Y shape. The branched optical waveguides 6 are entirely coated by a silicon dioxide ($SiO_2$) film as a buffer layer for preventing absorption of light. Thereafter, a pair of the electrodes 3 are formed in the vicinity of the branching portion of the branched optical waveguides 6. The electrodes 3 are connected to the rod antennas 4 outside of the substrate 2.

Figure 12:
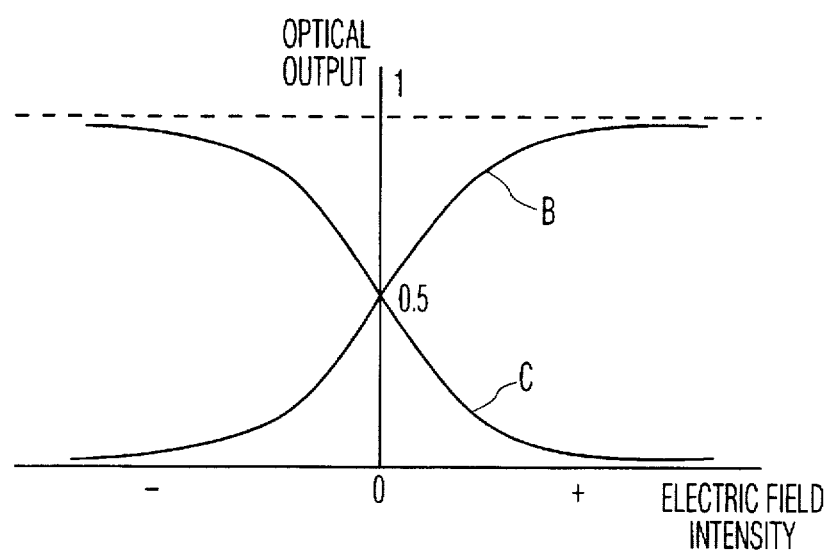
FIG. 12 is a diagram showing a characteristic of the sensor head illustrated in FIG. 11.

When the electric field is applied to the sensor head, the refractive index is increased at one of the two branched optical waveguides 6 and decreased at the other in the vicinity of the branching portion of the branched optical waveguides 6. As a result, the sensor head exhibits the output characteristic as depicted by curves B and C in FIG. 12. Specifically, in correspondence to variation of the electric field intensity of the applied electric field, the intensity of the light beam emitted to one optical fiber 9 is uniformly increased while the intensity of the light beam emitted to the other optical fiber 9 is decreased in symmetry therewith. When the intensity of the applied electric field is equal to zero, the intensity of each outgoing light beam is equal to ½ of the maximum level.

In this embodiment, one of the optical fibers 9 alone may be provided. When the electric field intensity is high, the rod antennas 4 are unnecessary and the electrodes 4 formed on the surface of the substrate 2 themselves can detect the electric field.

Figure 13:
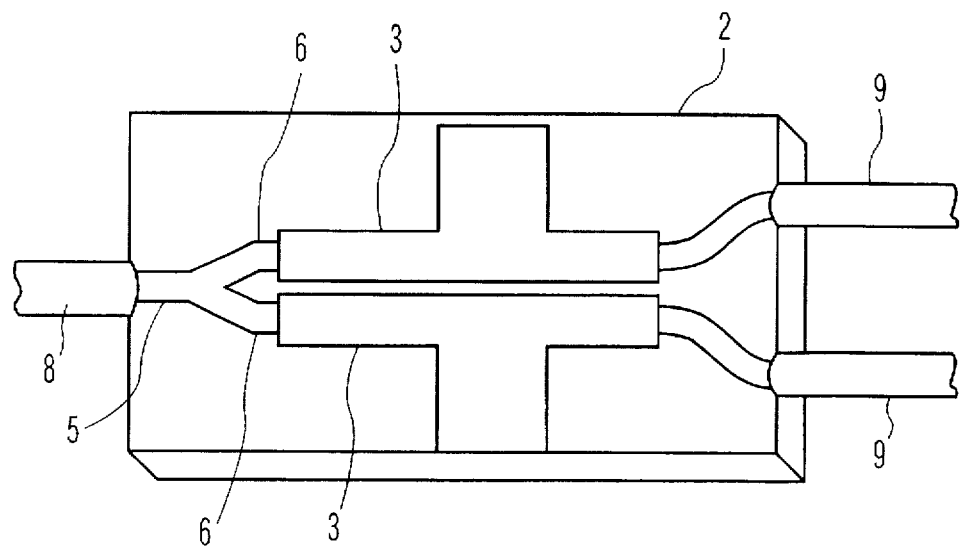
FIG. 13 is a diagram showing another sensor head which can be used in place of the sensor head illustrated in FIG. 4.

Referring to FIG. 13, a sensor head illustrated comprises similar parts designated by like reference numerals as those in FIG. 11. The sensor head comprises an incident optical waveguide 5 formed on a substrate 2, two branched optical waveguides 6 branched therefrom and arranged adjacent to each other over a predetermined length, and a pair of electrodes 3 formed in the vicinity of the branched optical waveguides 6.

Figure 14:
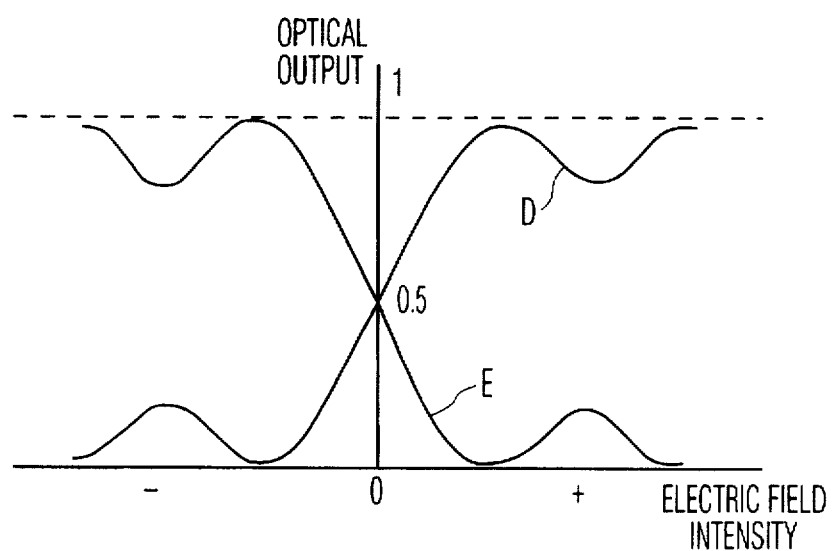
FIG. 14 is a diagram showing a characteristic of the sensor head illustrated in FIG. 13.

When an electric field is applied to the sensor head, the refractive index is increased in one of the two branched optical waveguides 6 and decreased in the other. As a result, a phase mismatch is produced between branched incident light beams in correspondence to variation of the electric field intensity. Accordingly, the light waves are mutually transferred between the optical waveguides to produce optical outputs having characteristics symmetrical with each other as depicted by curves D and E in FIG. 14. When the intensity of the applied electric field is equal to zero, outgoing light beams of two optical fibers 9 have the same light intensity which is equal to ½ of the maximum level.

Any one of the optical fibers 9 alone may be provided on demand. When the electric field intensity is low, the rod antennas 4 are connected to the electrodes 3 for supplement.

Figure 15:
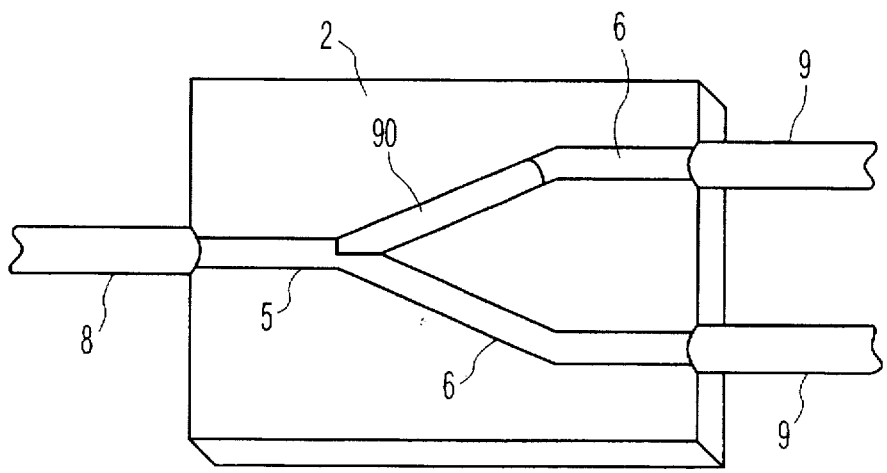
FIG. 15 is a diagram showing still another sensor head which can be used in place of the sensor head illustrated in FIG. 4.

Referring to FIG. 15, a sensor head illustrated comprises similar parts designated by like reference numerals as those in FIG. 11. The sensor head has an electric field shielding member 90 arranged in the vicinity of at least a part of a branching portion of branched optical waveguides 6 for shielding an electric field. The electric field shielding member 90 is made of an electroconductive material or a radio wave absorbing material.

The electric field is shielded by the electric field shielding member 90 arranged on one of the branched optical waveguides 6. In the other optical waveguide 6, the refractive index is varied in dependence upon the applied electric field. As a result, the electric field sensor exhibits the output characteristic illustrated in FIG. 12, like the sensor head in FIG. 11. When no electric field is applied, the light intensities at two optical fibers 9 are identical with each other and equal to ½ of the maximum level. The sensor head is advantageous in that the structure is simple and that the electric field shielding member 90 is not damaged from discharge even in a high electric field.

Figure 16:
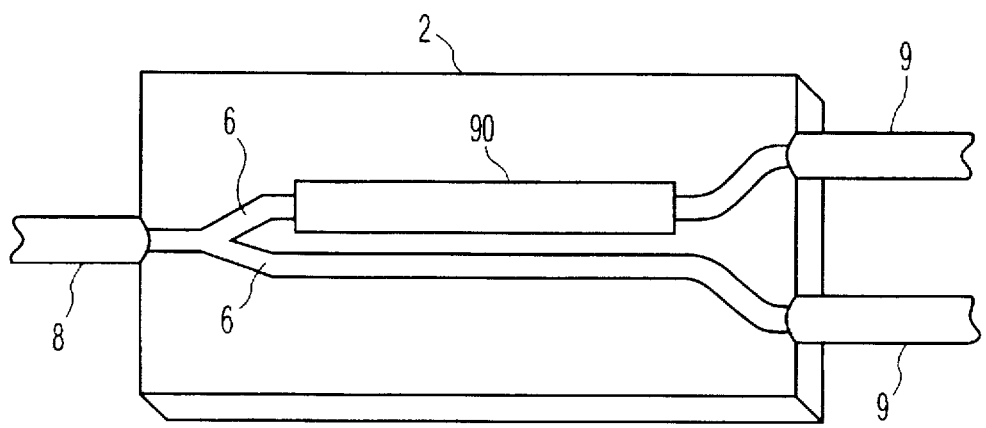
FIG. 16 is a diagram showing a further sensor head which can be used in place of the sensor head illustrated in FIG. 4.

Referring to FIG. 16, a sensor head illustrated comprises similar parts designated by like reference numerals as those in FIG. 15. The sensor head has an electric field shielding member 90 arranged in the vicinity of a part of branched optical waveguide 6 for shielding an electric field.

In this sensor head, the electric field is shielded in an area where the electric field shielding member 90 is present. In the other branched optical waveguide 6, the refractive index is varied in dependence upon the applied electric field. As a result, the light waves are mutually transferred between the branched optical waveguides 6 in correspondence to variation of the intensity of the applied electric field. Outgoing light beam emitted from the two optical waveguides have light intensities exhibiting the characteristics illustrated in FIG. 14, like the sensor head in FIG. 13. When no electric field is applied, the light intensities at the two output fibers are identical with each other and equal to ½ of the maximum level. Like the embodiment in FIG. 15, this sensor head is advantageous in that the structure is simple and that the electric field shielding member 90 is not damaged from discharge even in a high electric field.

Figure 17:
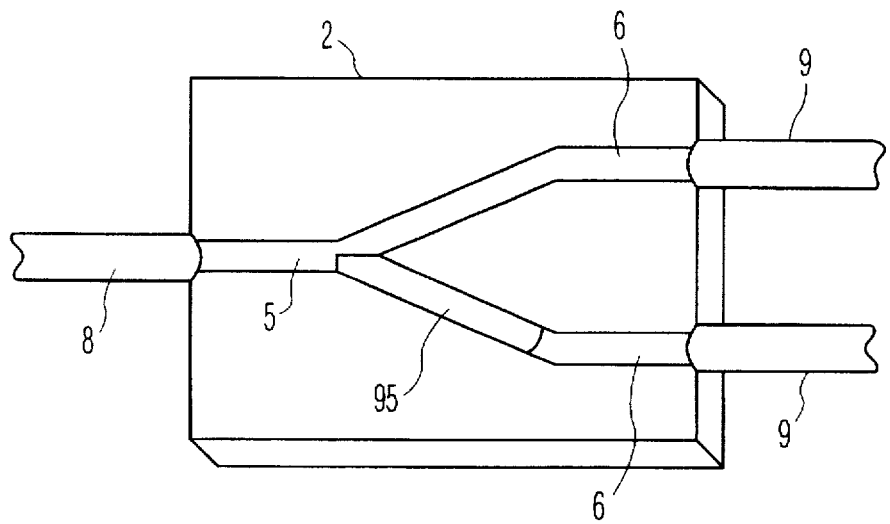
FIG. 17 is a diagram showing a still further sensor head which can be used in place of the sensor head illustrated in FIG. 4.

Referring to FIG. 17, a sensor head illustrated comprises similar parts designated by like reference numerals as those in FIG. 11. The sensor head comprises a substrate 2 made of a ferroelectric crystal and a reversely polarized area 95 formed at a branching portion of branched optical waveguides 6 and having a polarization direction different from that of a surrounding area.

In this sensor head, the refractive index of one branched optical waveguide 6 having the reversely polarized area 95 inversely varies with respect to the refractive index of the other branched optical waveguide 6 when an electric field is applied thereto. As a result, the sensor head exhibits the output characteristic illustrated in FIG. 12. That is, in correspondence to the variation of the intensity of the applied electric field, the light intensity emitted to one optical fiber 9 is uniformly increased and the light intensity emitted to the other outgoing optical fiber 9 is decreased in symmetry therewith. When the intensity of the applied electric field is equal to zero, each optical output is equal to ½ of the maximum level. This sensor head is wholly made of a nonmetallic material. Accordingly, the sensor head itself never disturbs the electric field and has a high voltage-durability.

Figure 18:
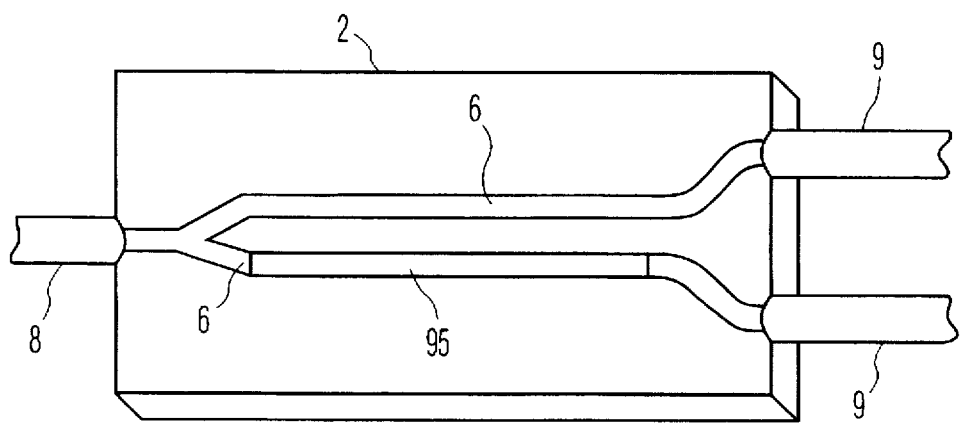
FIG. 18 is a diagram showing a different sensor head which can be used in place of the sensor head illustrated in FIG. 4.

Referring to FIG. 18, a sensor head illustrated comprises similar parts designated by like reference numerals as those in FIG. 17. The sensor head comprises a substrate 2 made of a ferroelectric crystal and a reversely polarized area 95 formed at a part of the branched optical waveguide 6 and having a polarization direction different from that of a surrounding area.

In this sensor head, the refractive index of one branched optical waveguide 6 having the reversely polarized area 95 inversely varies with respect to the refractive index of the other branched optical waveguide 6 when an electric field is applied thereto. As a result, the sensor head exhibits the output characteristic illustrated in FIG. 14. That is, in correspondence to the variation of the intensity of the applied electric field, the light intensity emitted to one optical fiber 9 is uniformly increased and the light intensity emitted to the other optical fiber 9 is decreased in symmetry therewith. When the intensity of the applied electric field is equal to zero, each optical output is equal to ½ of the maximum level. Like the sensor head illustrated in FIG. 17, this sensor head is made of a nonmetallic material. Accordingly, the sensor head itself never disturbs the electric field and has a high voltage-durability.

EFFECT OF THE INVENTION

As described above, according to this invention, there is provided an electric field sensor which is small in size and is capable of detecting an electric field and a noise in a narrow space.

According to this invention, there is also provided an electric field sensor which prevents production of a noise by a measuring system itself and capture of any other noise by other structural components except the sensor.

According to this invention, there is also provided an electric field sensor in which presence of a measuring system has no influence upon a measurement objective system.

According to this invention, there is also provided an electric field sensor which is capable of carrying out non-contacting measurement of an electric field produced on a surface of a circuit element.

According to this invention, there is also provided an electric field sensor which is capable of detecting an electric field generated by a high-voltage device without contacting the high-voltage device and which is improved in safety and is easy in installation.

According to this invention, there is also provided an electric field sensor which has a bias point constantly located at a middle point between a peak and a valley, which is hardly affected by tolerances and process conditions in manufacture, and which has a constant sensitivity.

I claim:

1. An electric field sensor comprising:

a sensor head for producing a transmitted light wave having an intensity which varies in dependence upon an intensity of an electric field applied thereto;

a light source for producing a light wave;

a first optical fiber for delivering said light wave from said light source to said sensor head;

a photoelectric transducer for converting an input light wave into an electric signal; and a second optical fiber for delivering to said photoelectric transducers, as said input light wave, said transmitted light wave of said sensor head;

said sensor head being located out of contact with a measurement object for detecting, as a variation in light intensity, said electric field applied by said measurement object;

wherein:

said sensor head is an electrodeless sensor head which comprises a substrate; and a branch interference type optical waveguide arranged on said substrate and including first and second branched optical waveguides having refractive indexes which vary in dependence upon the intensity of said electric field applied thereto;

said branch interference type optical waveguide is responsive to said light wave incident from said first optical fiber for branching said light wave by said first and said second branched optical waveguides into branch waves which are combined to be emitted to said second optical fiber;

said substrate of said sensor head is made of a ferroelectric crystal; and at least a part of an area of said substrate, in which one of said first and said second branched optical waveguides is formed, has a polarization direction substantially opposite to another polarization direction of a remaining area of said substrate.

* * * * *